United States Patent [19]

Kinugawa

[11] Patent Number: 5,215,936
[45] Date of Patent: Jun. 1, 1993

[54] METHOD OF FABRICATING A SEMICONDUCTOR DEVICE HAVING A LIGHTLY-DOPED DRAIN STRUCTURE

[75] Inventor: Masaaki Kinugawa, Tokyo, Japan
[73] Assignee: Kabushiki Kaisha Toshiba, Kawasaki, Japan
[21] Appl. No.: 292,112
[22] Filed: Dec. 30, 1988

Related U.S. Application Data

[62] Division of Ser. No. 917,146, Oct. 9, 1986, abandoned.

[51] Int. Cl.$^5$ .......................................... H01L 21/336
[52] U.S. Cl. ........................................ 437/44; 437/186
[58] Field of Search ............... 437/40, 41, 44, 34, 437/69, 186, 233, 235; 357/23.3, 23.9, 23.11

[56] References Cited

U.S. PATENT DOCUMENTS

| | | | |
|---|---|---|---|
| 4,577,391 | 3/1986 | Hsia et al. | 437/44 |
| 4,637,124 | 1/1987 | Okuyama et al. | 437/41 |
| 4,656,492 | 4/1987 | Sunami et al. | 357/23.3 |
| 4,717,684 | 1/1988 | Katto et al. | 437/34 |
| 4,753,898 | 6/1988 | Parrillo et al. | 437/44 |
| 4,837,173 | 6/1989 | Alvis et al. | 437/44 |

FOREIGN PATENT DOCUMENTS

| | | | |
|---|---|---|---|
| 0045076 | 4/1981 | Japan | 437/44 |
| 0200418 | 11/1984 | Japan | 437/69 |
| 136376 | 7/1985 | Japan . | |

OTHER PUBLICATIONS

Bampi et al., "Modified LDD Device Structures for VLSI", IEDM 1985, Dec., pp. 234-237.
Matsumoto et al., "Optimized and Reliable LDD Structure for 1 μm NMOSFET Based on Substrate Current Analysis", IEDM 1983, pp. 392-395.
Tsang et al., "Fabrication of High-Performance LDDFET's with Oxide Sidewall-Spacer Technology", IEEE Trans. on Electron Devices, ED-29, 4, Apr. 1982, pp. 590-596.
Takeda et al., "An As-P(N+-N-) Double Diffused Drain MOSFET for VLSIs", 1982 Symp. on VLSI Technology, Digest of Papers, Paper No. 3-3, pp. 40-41.
Ogura et al., "Design and Characteristics of the Lightly Doped Drain Source (LDD) Insulated Gate Field-Effect Transistor," IEEE Transactions on Electron Devices, vol. ED-27, No. 8, Aug. 1980.
Hsu et al., "Evaluation of LDD MOSFET's Based on Hot-Electron-Induced Degradation," IEEE Electron Device Letters, vol. EDL-5, No. 5, May 1984.
Kinugawa et al., "Submicron MLDD NMOSFETS for 5V Operation," Semiconductor Device Engineering Laboratory, vol. IX-8 (date unknown).
Hori, "½-m LATID (Large-Tilt-angle Implanted Drain) Technology for 3.3-V Operation," IEDM 89-777 (1989).

Primary Examiner—Mary Wilczewski
Attorney, Agent, or Firm—Finnegan, Henderson, Farabow, Garrett & Dunner

[57] ABSTRACT

A semiconductor device includes a semiconductor body of one conductivity type, source and drain regions formed in the surface area of the semiconductor body, a gate insulating film formed on the semiconductor body between the source and drain regions, a gate electrode formed on the gate insulating film, an insulating member formed on the source and drain regions and in contact with the side walls of the gate electrode. Each of the source and drain regions includes a first impurity region of the opposite conductivity type and a second impurity region having a higher impurity concentration than that of the first impurity region and formed in the first impurity region to extend below the gate electrode.

5 Claims, 3 Drawing Sheets

METHOD OF FABRICATING A SEMICONDUCTOR DEVICE HAVING A LIGHTLY-DOPED DRAIN STRUCTURE

This is a division of application Ser. No. 917,146, filed Oct. 9, 1986, now abandoned.

BACKGROUND OF THE INVENTION

This invention relates to a semiconductor device having a lightly-doped-drain structure and a method of manufacturing the same.

Generally, a fine structure MOS semiconductor device has a lightly-doped-drain (LDD) structure to suppress generation of hot carriers. A method of manufacturing a prior art MOS transistor having an LDD structure will be described with reference to FIG. 1.

First, gate oxide film 2 is formed on p-type silicon substrate 1, for instance. Then, a polycrystalline silicon film is formed on the entire surface and selectively etched to form gate electrode 3 on gate oxide film 2. Then, with gate electrode 3 as a mask, phosphorus is ion-implanted into substrate 1, thus forming $n^-$-type impurity regions 4A and 4B in the surface area of substrate 1. Subsequently, a CVD oxide film is formed over the entire surface and selectively etched by a reactive ion-etching (RIE) process to leave spacers 5A and 5B which are in contact with the side wall of gate electrode 3. Subsequently, with gate electrode 3 and spacers 5A and 5B as a mask, arsenic is ion-implanted into substrate 1, thus forming $n^+$-type regions 6A and 6B in $n^+$-type regions 4A and 4B.

$N^-$- and $n^+$-type regions 4A and 6A constitute source region 7, and $n^-$- and $n^+$-type regions 4B and 6B constitute drain region 8.

Thereafter, as is well known in the art, an insulating layer is formed on the semiconductor structure shown in FIG. 1, contact holes are formed in the insulating layer, then aluminum is deposited, for instance, on the insulating layer and patterned to form an aluminum wiring layer.

In the MOS transistor of the LDD structure obtained in this way, the electric field in a channel region near drain region 8 is alleviated, so that generation of hot carriers in drain region 8 is suppressed to obtain a highly reliable operation.

In the MOS transistor of the structure of this type, the length of the diffusion region extending from the end of $n^+$-type region 6B of the $n^-$-type region 4B constituting the drain region 8 is made as large as possible, while holding the parasitic resistance of the diffusion portion to be less than a permissible value to enhance the breakdown voltage. For example, with the MOS transistor having an LDD structure formed on the basis of a 0.8 to 1.2 $\mu$ rule, spacer 5B for determining the length of the diffusion portion noted above is set to 0.20 to 0.25 $\mu$m.

Further, in the fine structure MOS transistor $n^+$-type regions 6A and 6B, constituting source and drain regions 7 and 8, have a depth of approximately 0.2 $\mu$m. This is done so that in order to alleviate the electric field in the channel region near drain region 8 in a case where $n^+$-type regions 6A and 6B are deeper, it is necessary to form $n^-$-type regions 4A and 4B to be deep. When $n^-$-type regions 4A and 4B are formed to be deep, a short-channel effect is liable to result. Where the width of $n^+$-type regions 6A and 6B is set to 0.20 to 0.25 $\mu$m and the depth of $n^+$-type regions 6A and 6B is set to approximately 0.2 $\mu$m, the end of $n^+$-type regions 6A and 6B is found on the lower side of spacers 5A and 5B.

In FIG. 2, the rate of triode channel current reduction, with respect to the stress application time in a MOS transistor of an LDD structure shown in FIG. 1, and a MOS transistor with an ordinary structure without an impurity region, is shown as respective solid lines A and B. The MOS transistor having an ordinary structure used for a bias stress test has a gate length of 0.9 $\mu$m and a film thickness of 200 Å (0.02 $\mu$m). The impurity concentration of the $n^-$-type region is $1 \times 10^{18}$ cm$^{-3}$. The other conditions are the same as the MOS transistor having an ordinary structure.

In FIG. 2, the ordinate is taken for the percentage of the difference $\Delta ID$ between the drain current ID, obtained when a gate voltage of 2 V and a drain voltage of 6.5 V are applied, and the drain current obtained when bias stress (including a gate voltage of 3 V and a drain voltage of 8 V) is applied with respect to the current ID; the abscissa is taken for the bias stress application period.

As is obvious from solid line A in FIG. 2, with the MOS transistor having an ordinary structure, the drain current reduction rate is increased at a comparatively greater rate with increasing stress application time. As is obvious from solid line B, in the LDD structure MOS transistor the reduction rate of drain current varying with change in the stress application time is comparatively low, but the drain current reduction rate in an initial stage of the bias stress test, i.e., initial degradation, is large. In the LDD structure MOS transistor, the initially expected high reliability can not be attained.

SUMMARY OF THE INVENTION

An object of the invention is to provide a LDD structure MOS device which is less subject to performance deterioration and a method of manufacturing the same.

To attain the above object of the invention, there is provided a semiconductor device, which comprises a semiconductor body of one conductivity type, source and drain regions formed in surface portions of the semiconductor body, a gate insulating film formed on the semiconductor body over the source and drain regions, a gate electrode formed on the gate insulating film, an insulating member formed on the source and drain regions and in contact with the side wall of the gate electrode, each of the source and drain regions including a first impurity region of the opposite conductivity type and a second impurity region having a higher impurity concentration than that of the first impurity region.

Also to attain the above object of the invention, there is provided a method of manufacturing a semiconductor device, which comprises a step of forming a gate insulating film on a semiconductor body of one conductivity type, a step of forming a gate electrode on the gate insulating film, a step of ion-implanting an impurity into the semiconductor body with the gate electrode as a mask, followed by a thermal treatment to form first and second impurity regions of the opposite conductivity type in surface portions of the semiconductor body, a step of forming an insulating member on the first and second impurity regions so as to be in contact with at least the side wall of the gate electrode, and a step of ion-implanting an impurity of the opposite conductivity type into the first and second impurity regions with said first gate and insulating member as a mask, followed by a thermal treatment to form third and fourth impurity regions with an end portion located below the gate electrode and having a higher impurity concentration than the impurity concentration of the first and second impurity regions.

DETAILED DESCRIPTION OF THE PREFERRED EMBODIMENT

The inventor has investigated the cause of increase of the initial degradation of the MOS transistor of the LDD structure. As the cause of the initial degradation, it is presumed that in the MOS transistor having the LDD structure shown in FIG. 1, hot electrons generated in $n^-$-type- region 4B are injected into a portion 5X of spacer 5B between gate electrode 3 and $n^+$-type region 6B. When hot carriers are trapped in this portion 5X, carriers or electrons generated in $n^-$-type region 4B with an impurity concentration of $1 \times 10$ cm$^{-3}$ are substantially repelled by the trapped hot carriers. As a result, the substantial parasitic resistance of $n^-$-type region 4B is increased to increase the reduction rate of the channel current and drain current. The inventor further has experimentally verified that the initial degradation peculiar to the LDD structure MOS transistor is further pronounced when the gate length is less than 1.2 μm, e.g., 0.8 μm.

On the basis of this fact, the inventor has noted that in order to improve the operating characteristics of the LDD structure MOS device, the influence of hot carriers trapped in a portion of spacer 5B on the operating characteristics of the MOS device may be suppressed by providing a high impurity concentration region under spacer 5B.

Figure 3A:
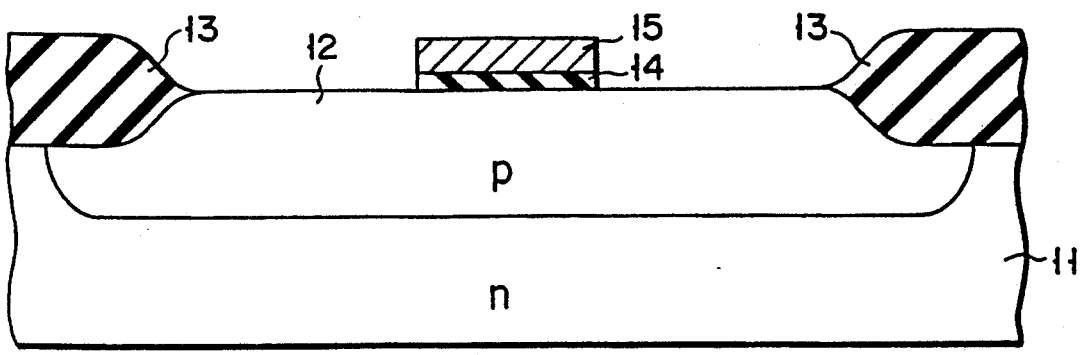
FIGS. 3A through 3D are views illustrating the manufacture of an embodiment of the MOS device having a LDD structure according to the invention.
Figure 3B:
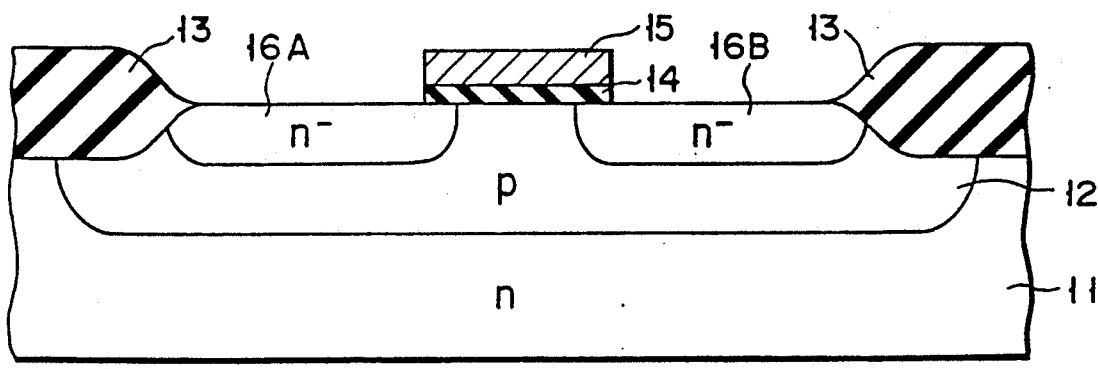
Figure 3C:
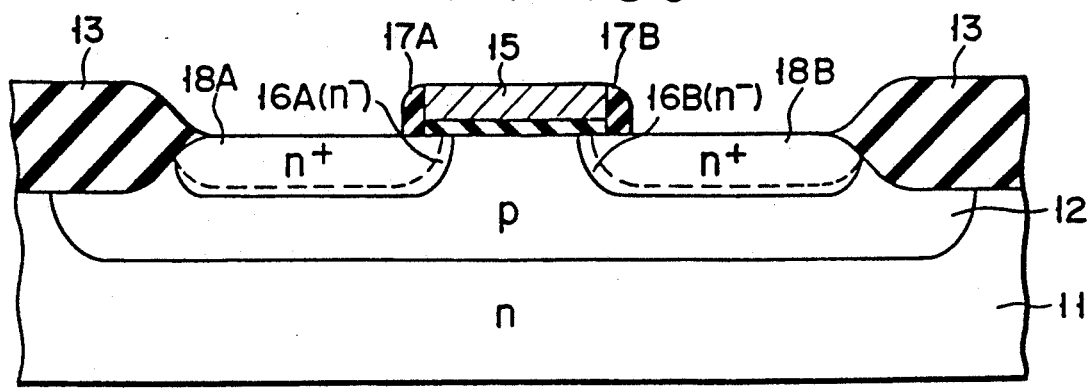
Figure 3D:
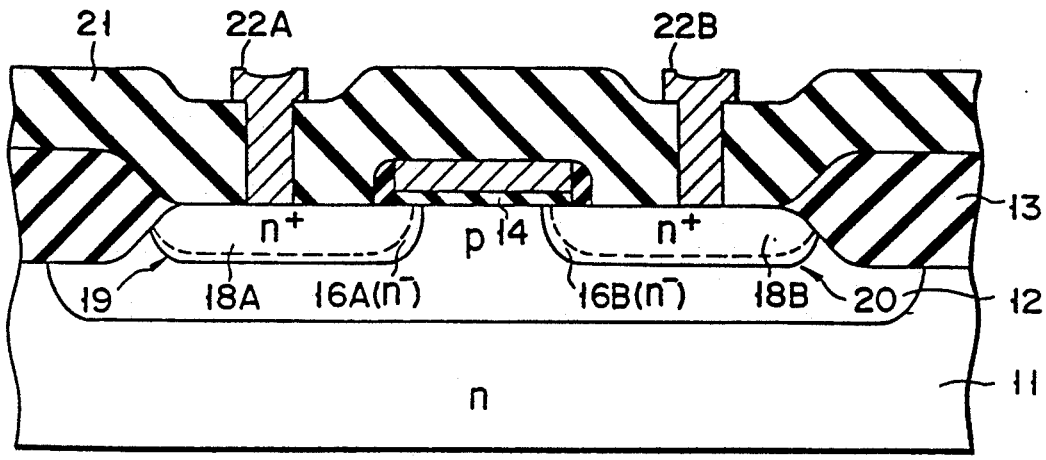

Now, a method of manufacture of an embodiment of the semiconductor device according to the invention will be described with reference to FIGS. 3A to 3D.

p-type well region 12 is formed in n-type silicon substrate 11 by selectively diffusing phosphorus into n-type silicon substrate 11 from the surface thereof. Then, a field oxide film 13 is formed by a selective oxide process to surround the element region of p-type well region 12. Then, gate oxide film 14 with a thin thickness of 200 Å is formed on the element region surface surrounded by field oxide film 13. Then, a polycrystalline silicon film is deposited to a thickness of 4,000 Å over the entire surface by the CVD process, and then phosphorus is diffused using POCl$_3$ as a diffusion source to reduce the resistivity of the polycrystalline silicon. Then, the polycrystalline silicon film is patterned to form gate electrode 15 with a gate length of 0.9 μm. Subsequently, with gate electrode 15 as a mask, phosphorus ions are implanted with an acceleration energy of 60 keV and a dose of $4 \times 10^{13}$ cm$^{-2}$, followed by annealing in a nitrogen atmosphere at 900° C. for 30 minutes. Thus, $n^-$-type regions 16A and 16B are formed with a depth of $x_j$ (=0.20 μm) as shown in FIG. 3B. Then, a CVD oxide film is deposited in a thickness of 1,500 Å over the entire surface by the CVD process, and then etched by the reactive ion-etching (RIE) process as shown in FIG. 3C, thus forming spacers 17A and 17B with a width of 1,500 Å (=0.15 μm) on the side wall of gate electrode 15, as shown in FIG. 3C. Then, with gate electrode 15 and spacers 17A and 17B as a mask, arsenic ions are implanted with an acceleration energy of 40 keV and a dose of $2 \times 10^{15}$ cm$^{-2}$, followed by annealing in a nitrogen atmosphere at 900° C. for 120 minutes. Thus, $n^+$-type regions 18A and 18B with a depth of $x_j$ (=0.2 μm) are formed, such that the diffusion end portion extends below gate electrode 15. As a result, as shown in FIG. 3C source 19 is formed, which includes $n^-$-type region 16A and $n^+$-type region 18A, and drain 20 is formed, which includes $n^-$-type region 16B and $n^+$-type region 18B. Then, as shown in FIG. 3D, CVD oxide film 21 is deposited as an inter-layer insulating film over the entire surface, and then contact holes are formed therein. Subsequently, aluminum is deposited over the entire surface and patterned to form electrodes 22A and 22B, thus obtaining a MOS transistor having a LDD structure.

With the LDD structure MOS transistor, since high concentration $n^+$-type layers 18A and 18B are formed below spacers 17A and 17B which are formed in contact with the side walls of gate electrode 15, even if carriers are injected into the oxide film, only a small proportion of carriers generated in $n^+$-type layers 18A and 18B are repelled by hot carriers entering spacers 17A and 17B. It is thus possible to extremely reduce the rate of channel current reduction.

When the gate length becomes less than 1.2 μm, the junction depth of a high impurity concentration diffusion layer necessary to guarantee the normal transistor action is approximately 0.2 μm. Therefore, in order that the end portions of the high impurity concentration layers constituting the source and drain regions extend below the gate electrode, the width of spacers 17A and 17B formed in contact with the side walls of the gate electrode may be 0.15 μm or less.

Figure 1:
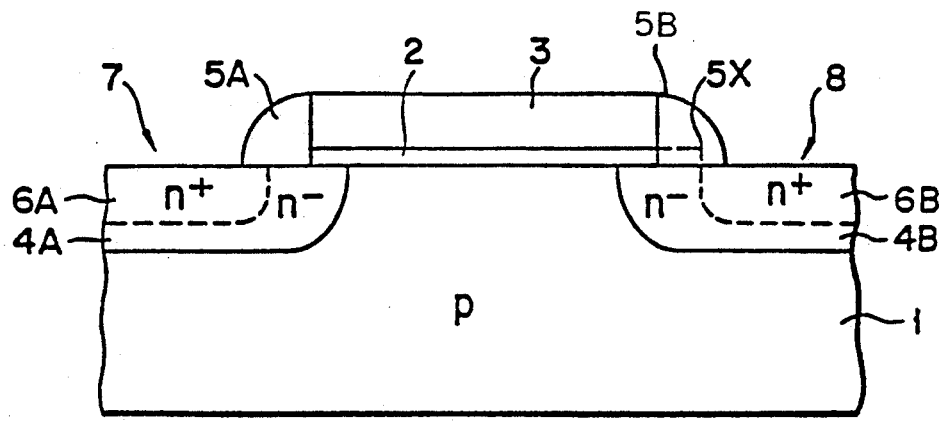
FIG. 1 is a prior art MOS device having a LDD structure.
Figure 2:
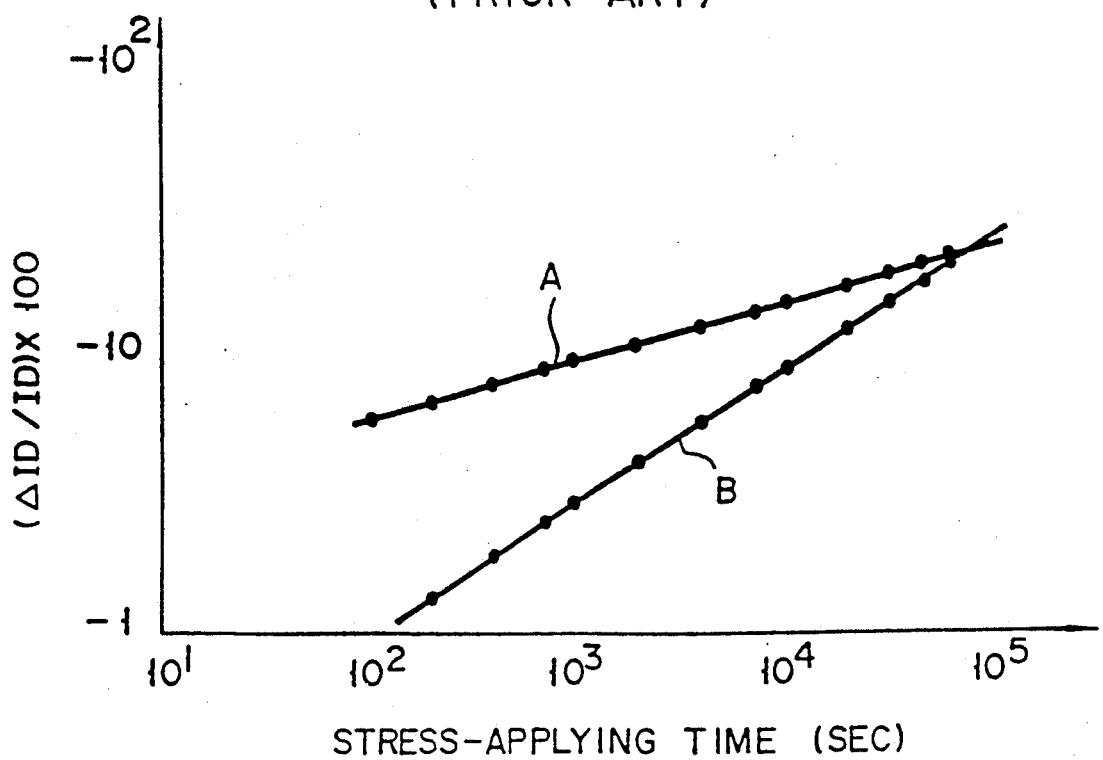
FIG. 2 is a graph showing the rate of triode channel current reduction with respect to the MOS device shown in FIG. 1 and a MOS device having an ordinary structure.
Figure 4:
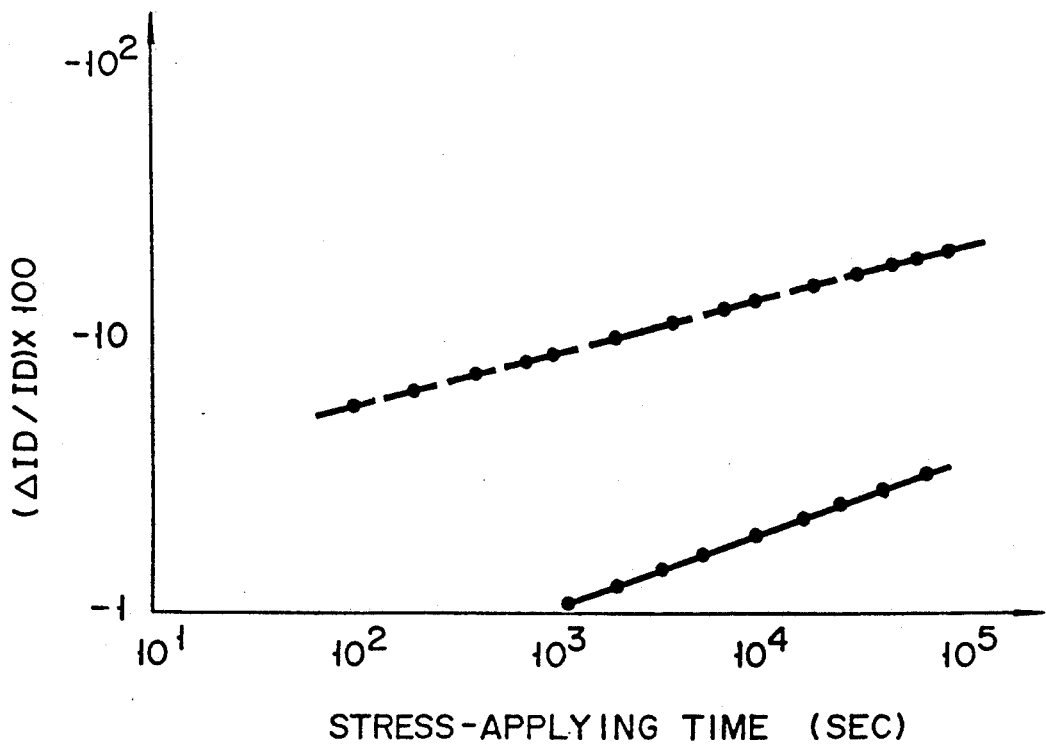
FIG. 4 is a graph showing the rate of channel current reduction obtained as a result of a bias stress test with respect to a MOS device obtained in the manufacture process shown in FIGS. 3A to 3D.

FIG. 4 shows the relation between the rate of reduction in triode channel current and stress application time obtained as a result of bias stress tests conducted with the MOS transistor shown in FIG. 3D, under the same conditions as described before, with reference to FIG. 2. To facilitate comparison, the relation between the rate of channel current reduction and stress application time in the MOS device shown in FIG. 1 is shown by a dashed line. As is obvious from FIG. 4, the initial value of the rate of reduction in triode channel current or initial degradation in the MOS transistor is far less when compared with the case of the prior art MOS transistor shown in FIG. 2. In addition, the rate of increase in the reduction rate of triode channel current is small when compared with the case of the MOS transistor having an ordinary structure.

What is claimed is:

1. A method of manufacturing a semiconductor device comprising the steps of:
    forming a gate insulating film on a semiconductor body of one conductivity type;
    forming a gate electrode on said gate insulating film;
    ion-implanting an impurity into said semiconductor body with said gate electrode as a mask, followed by a thermal treatment to form lightly doped first and second impurity regions of the opposite conductivity type in the surface area of said semiconductor body, the first and second impurity regions having diffusion end portions extending below said gate electrode for a predetermined distance;

forming an insulating member on said first and second impurity regions and in contact with at least the side walls of said gate electrode; and ion-implanting an impurity of the opposite conductivity type into said first and second impurity regions with said first gate and insulating member as a mask, followed by a thermal treatment to form highly doped third and fourth impurity regions within said first and second impurity regions, respectively, with end portions located below said gate electrode and having a higher impurity concentration than the impurity concentration of said first and second impurity regions.

2. The method according to claim 1, wherein insulating film is formed by forming an insulating layer on said gate electrode and said first and second impurity regions and selectively removing said insulating layer by a reactive ion-etching process.

3. The method according to claim 2, wherein said insulating member has a width of 0.15 μm or less.

4. The method according to claim 1, wherein phosphorus is used for the formation of said first and second impurity concentration regions, and arsenic is used for the formation of said third and fourth impurity regions.

5. The method according to claim 1, wherein said insulating member has a width of 0.15 μm or less.

* * * * *